United States Patent
Kam et al.

(10) Patent No.: US 8,847,335 B2
(45) Date of Patent: Sep. 30, 2014

(54) MEMBRANE STRUCTURE FOR ELECTROCHEMICAL SENSOR

(75) Inventors: Shian-Yeu Kam, Singapore (SG); Tien-Choy Loh, Singapore (SG); Ying Yu, Singapore (SG); Fery Riswan, Singapore (SG); Frederic Sala, Singapore (SG)

(73) Assignee: STMicroelectronics Pte Ltd., Singapore (SG)

( * ) Notice: Subject to any disclaimer, the term of this patent is extended or adjusted under 35 U.S.C. 154(b) by 0 days.

(21) Appl. No.: 13/597,044

(22) Filed: Aug. 28, 2012

(65) Prior Publication Data

US 2014/0061823 A1   Mar. 6, 2014

(51) Int. Cl.
*H01L 27/14* (2006.01)
*B82Y 40/00* (2011.01)
*G01N 27/74* (2006.01)
*G01R 33/09* (2006.01)
*G11B 5/39* (2006.01)

(52) U.S. Cl.
CPC .............. *B82Y 40/00* (2013.01); *G01R 33/093* (2013.01); *G01R 33/098* (2013.01)
USPC ........ 257/414; 257/421; 324/204; 204/403.1; 204/660

(58) Field of Classification Search
CPC ...... B82Y 25/00; B82Y 40/00; G01R 33/093; G01R 33/098; G01R 33/005; H01F 10/3254; H01F 41/16; G01N 27/327; G01N 27/745
USPC ................. 257/253, 414, 416, 417, 421, 428; 204/400, 403.01, 403.05, 403.06, 556, 204/660, 664; 205/792; 224/228, 230; 600/409; 324/204, 208, 214, 231; 435/401; 506/9; 96/11; 438/53
See application file for complete search history.

(56) References Cited

U.S. PATENT DOCUMENTS

| | | | |
|---|---|---|---|
| 7,419,821 B2 | 9/2008 | Davis et al. | |
| 7,682,833 B2 | 3/2010 | Miller et al. | |
| 7,723,099 B2 | 5/2010 | Miller et al. | |
| 2011/0138882 A1* | 6/2011 | Moon et al. | 73/31.06 |
| 2012/0034684 A1 | 2/2012 | Campbell et al. | |

\* cited by examiner

*Primary Examiner* — Tom Thomas
*Assistant Examiner* — John Bodnar
(74) *Attorney, Agent, or Firm* — Seed IP Law Group PLLC

(57) ABSTRACT

A micro-electrochemical sensor contains magnetic compounds inserted within a substrate that exert a magnetic force of attraction on paramagnetic beads held in contact with an electrode. The magnetic compounds can be contained within a fluid that is introduced into a void in the substrate. The electrode can be spaced apart from the magnetic compounds by a dielectric multi-layer membrane. During the fabrication process, different layers within the membrane-electrode structure can be tuned to have compressive or tensile stress so as to maintain structural integrity of the membrane, which is thin compared with the size of the void beneath it. During a process of forming the structure of the sensor, the tensile stress in a TiW adhesion layer can be adjusted to offset a composite net compressive stress associated with the dielectric layers of the membrane. The membrane can also be used in forming both the electrode and the void.

13 Claims, 10 Drawing Sheets

MEMBRANE STRUCTURE FOR ELECTROCHEMICAL SENSOR

BACKGROUND

1. Technical Field

The present disclosure relates to the fabrication of micro-electrochemical devices.

2. Description of the Related Art

A micro-electrochemical sensor can be formed, in a substrate, as a microscopic structure that provides a platform for a chemical process or reaction. Some reactions cause electrical effects such as changes in voltage or current that can be sensed by electrodes attached to the microstructure. Thus, such a microstructure provides an electrical detector that can be used to monitor the chemical process. Common examples of micro-electrochemical sensors include biosensors such as, for example, immunosensors that can be used to analyze biological samples, as described in U.S. Patent Application Publication No. 2012/0034684 (hereinafter, "the '684 patent application").

Semiconductor microstructures having dimensions in the range of about 1-10 microns can be manufactured for biotechnology applications using techniques, materials, and equipment similar to those that have been developed for the microelectronics industry. For reliability, it is important that microstructures that make up the platform are mechanically stable. In general, achieving a mechanically stable microstructure can be particularly challenging if, for example, the dimensions or the material properties of adjacent microstructural elements are very different from one another. For example, a multi-layer microscopic structure situated next to a macroscopic structure can be vulnerable to destructive events such as cracking, rupturing, peeling, or delamination of the layers. Such events can occur in response to development of a composite shear stress that results from imbalances in compressive and tensile stresses associated with the various layers of the microstructure. Structural instabilities that cause peeling or delamination of thin films on a silicon substrate are a recurring problem in the fabrication of electronic devices. Historically, this has been especially problematic near the boundaries of "trench isolation" areas formed in the silicon as electrical boundaries between neighboring transistors.

BRIEF SUMMARY

Different layers within a multi-layer membrane on a silicon substrate can be tuned to have compressive or tensile stress so as to maintain structural integrity of the membrane, during and after formation of a large void in the substrate beneath it. In particular, a Titanium Tungsten (TiW) adhesion layer having a selectable amount of tensile stress is found to be beneficial in maintaining secure contact between the electrode portion of the membrane and the dielectric portion of the membrane.

During a process of forming the structure of the multi-layer membrane, the tensile stress in the TiW layer can be adjusted to offset a composite net compressive stress associated with the dielectric layers of the membrane. Furthermore, the membrane dielectric can be used as an etch stop during formation of the electrode on a front side of the substrate, and also during formation of the void on a back side of the substrate.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

DETAILED DESCRIPTION

It will be appreciated that, although specific embodiments of the present disclosure are described herein for purposes of illustration, various modifications may be made without departing from the spirit and scope of the present disclosure. Accordingly, the present disclosure is not limited except as by the appended claims.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to a dielectric multi-layer membrane can include membranes other than those used to illustrate specific embodiments of the sensor device presented. The term "membrane" should not be construed narrowly to limit a micro-electrochemical structure solely to a three-layer membrane on a silicon substrate, for example, but rather, the term "membrane" is broadly construed to cover a dielectric that provides spacing between an electrode and one or more magnetic compounds inserted into a substrate.

Specific embodiments are described herein with reference to examples of micro-electrochemical sensor structures that have been produced; however, the present disclosure and the reference to certain materials, dimensions, and the details and ordering of processing steps are exemplary and should not be limited to those shown.

In the figures, identical reference numbers identify similar features or elements. The sizes and relative positions of the features in the figures are not necessarily drawn to scale.

Figure 1:
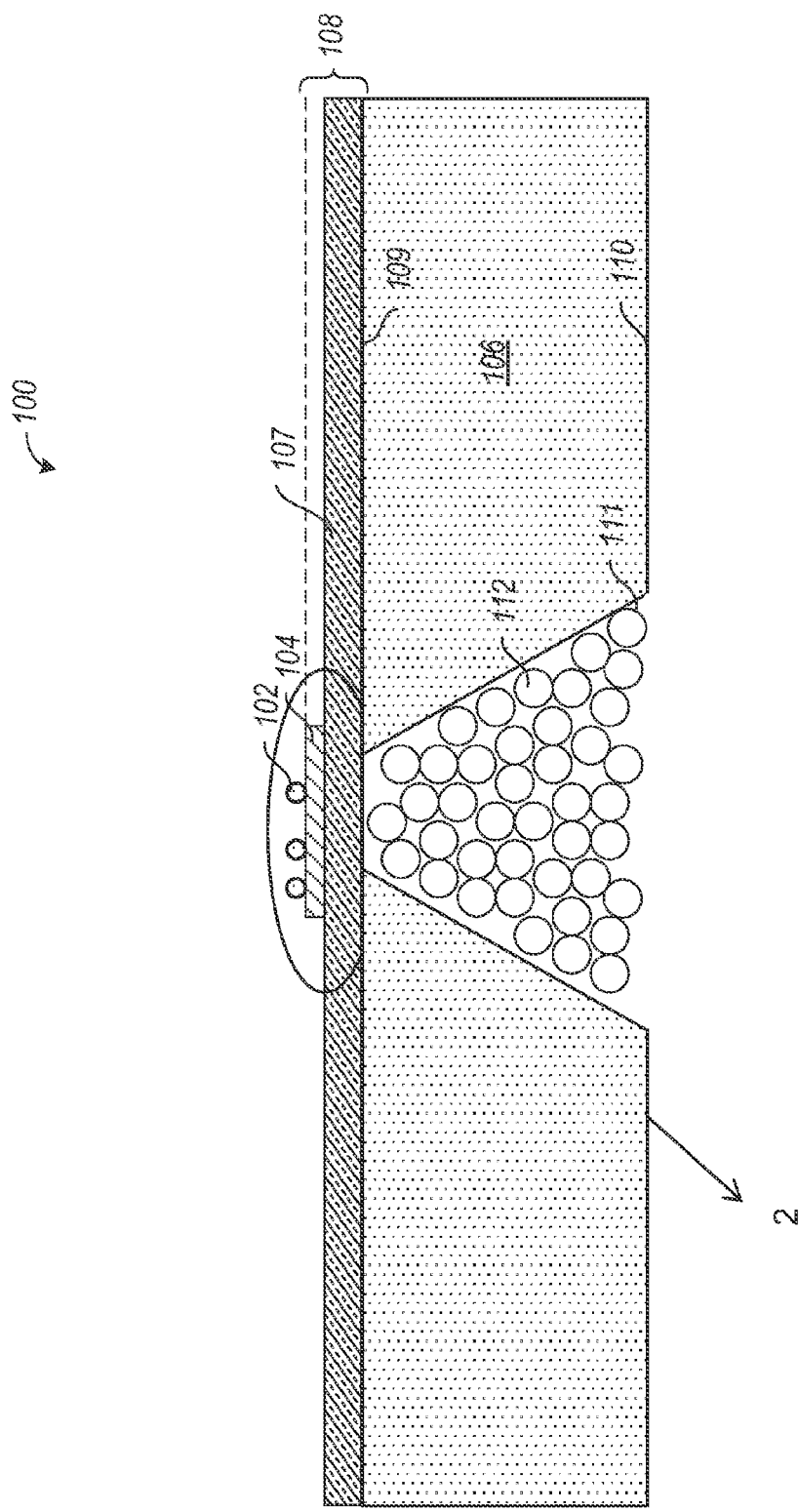
FIG. 1 is a side view of an exemplary micro-electrochemical sensor design in which magnetic beads used as sensors detect magnetic compounds through a multi-layer membrane.
Figure 2:
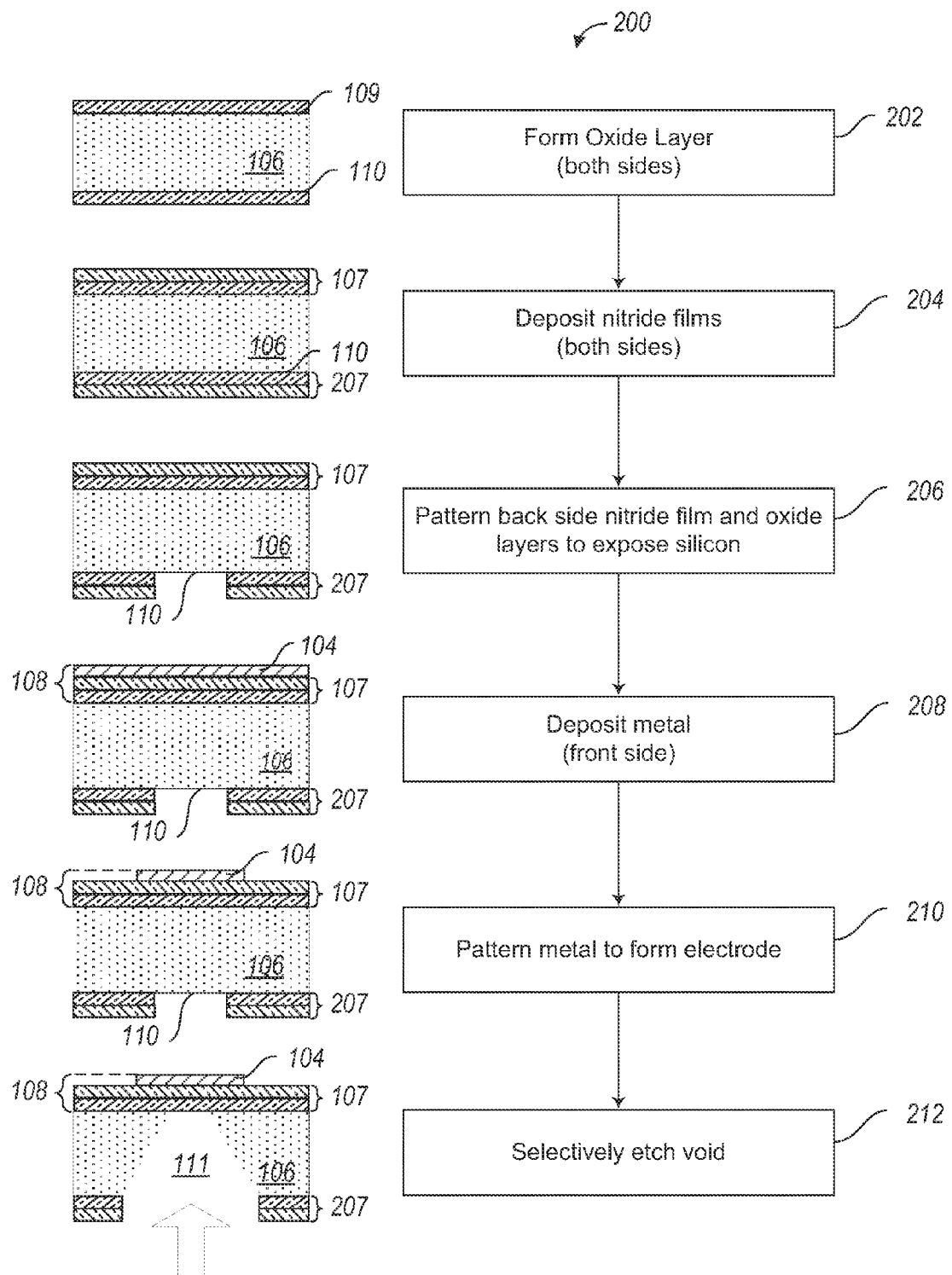
FIG. 2 is a high level process flow diagram illustrating the order of front side and back side processing steps for producing the structure of FIG. 1.

With reference to FIGS. 1 and 2, an exemplary micro-electrochemical sensor 100 is shown, in which a plurality of paramagnetic beads 102 are placed in contact with an electrode 104. The electrode 104 is located above, and spaced apart from, a substrate 106 by a supporting means such as a dielectric layer 107. The electrode 104 and the dielectric layer 107, together, form a multi-layer membrane 108. The substrate 106 has a front side 109 and a back side 110, onto which films may be deposited, or to which residual films may adhere. Once the membrane 108 is in place, the front side 109 becomes a "membrane-substrate interface." One or more voids 111, formed in the substrate 106, can accept a sample of a material that contains one or more magnetic compounds 112.

Paramagnetic materials are defined by their intrinsic magnetic permeability being greater than one. This property causes a paramagnetic material to respond to externally applied magnetic fields, without retaining any magnetization after the field is removed. Examples of paramagnetic materials include, for example, magnesium, molybdenum, and tantalum. In the exemplary sensor 100, the beads 102 have a substantially spherical shape, so that they are free to roll about on the surface of the electrode 104, unless they are held in place on the electrode by a force of magnetic attraction to the magnetic compounds 112 placed in the substrate 106. Variations in the magnetic force between the magnetic compounds 112 and the beads 102 result in variations in electric currents within the electrode 104. These varying electric currents can be sensed by an external circuit connected to the electrode 104. If the void 111 contains no sample, or if it contains a sample that lacks enough magnetic compounds, there may be an insufficient force to maintain the position of the beads, and this situation produces a measurable fluctuation in the electric current. Thus, the device functions as a detector for the presence of, and the amount of, the magnetic compounds 112 within the void 111.

The paramagnetic beads 102 can be made of any solid paramagnetic material. According to the embodiments described, the beads 102 can have a diameter ranging from about 1-50 microns.

The magnetic compounds 112 can be components of a material, such as a biological material, that has a magnetic signature, and which is capable of being introduced into the void 111. One application of the sensor 100 is a detector that senses the presence of the magnetic compounds 112 within a blood sample. In this embodiment, the magnetic compounds 112 can be blood cells that are magnetized, or that contain magnetically sensitive elements, for example, due to the presence of iron. However, embodiments of the invention are not so limited. The magnetic compounds can be inserted into the void via other types of carrier materials such as, for example, a gel, a paste, a powder, or a fluid, or without a carrier material. In one embodiment of the sensor 100, the dimensions of the void are much larger than the thickness of the multi-layer membrane 108. In other embodiments of the device 100, a liquid sample can spread out into interstitial regions (e.g., small voids) within the substrate instead of remaining localized in a large void.

The electrode 104 can be made of any electrically conducting material, such as a metal, metal alloy, and combinations thereof. The electrode 104 can include multiple layers, collectively referred to as a "metal stack." For bio-compatibility reasons, electrodes that include one or more layers made from noble or non-reactive metals such as gold, can be advantageous if the sensor is deployed within a biological system, or another type of aqueous or oxygen-rich environment. Such noble metals are corrosion resistant, and generally provide higher quality electrical signals.

The substrate 106 can be made of a semiconductor material such as silicon that benefits from a variety of existing processing technologies, but any substrate material that can be used as a platform on which the membrane 108 can be formed or attached, would be a suitable alternative.

Analysis of biological samples using existing magnetic micro-electrochemical sensors are described in more detail in publications such as the '684 patent application mentioned above, as well as in U.S. Pat. Nos. 7,419,821, 7,682,833, and 7,723,099, among others.

The disclosure herein is concerned particularly with the structure and formation of the membrane 108 on the front side 109 of the silicon substrate 106, and a large void 111 formed through the back side 110 of the substrate 106. A large void is one which is about 10-100 times wider than the thickness of the membrane. The membrane layers on the front side 109 are designed to help maintain structural integrity of the device 100, when it is situated over a large void 111, however, they also have a second purpose. According to an exemplary embodiment, the thin films making up the dielectric layer 107 are also deposited on the back side 110 so that, when the back side 110 is patterned, a back side layer serves as a mask for removing substrate material to create the void 111.

With reference to FIG. 2, a high-level process flow 200 is presented to describe formation of the structures shown in FIG. 1. Detailed descriptions of the process steps 202, 204, 206, 208, 210, 212 are presented below. Because the device 100 is formed by processing both sides of the substrate 106 at various times, a preliminary high-level discussion offers some additional clarification. In steps 202 and 204, oxide and nitride layers are formed on both sides of the substrate 106. On the front side 109, these layers form the dielectric layer 107 of the membrane 108, which remains a blanket, unpatterned structure throughout the process, and remains in the finished device 100. On the back side 110, these layers are patterned in step 206 and used as a hard mask 207 to permit formation of the deep void 111. When the hard mask patterning process is complete, a two-layer nitride/oxide hard mask has been formed, exposing regions of the underlying silicon substrate 106. Next, the front side is treated to deposit and pattern the metal electrode 104 in steps 208 and 210, respectively. These steps can occur in plasma deposition and etching equipment in which only the front side 109 of the substrate 106 is exposed to processing. After the electrode 104 is formed on top of the blanket dielectric layer 107, the back side 110 is further processed to selectively etch the deep void 111. This can be done by immersing the sample in a wet chemical etch that consumes exposed areas of the silicon substrate 106 at a high rate, but will not attack either the dielectric layer 107, or the hard mask 207. Thus, the silicon etch stops at the membrane-substrate interface at the front side 109.

Figure 3:
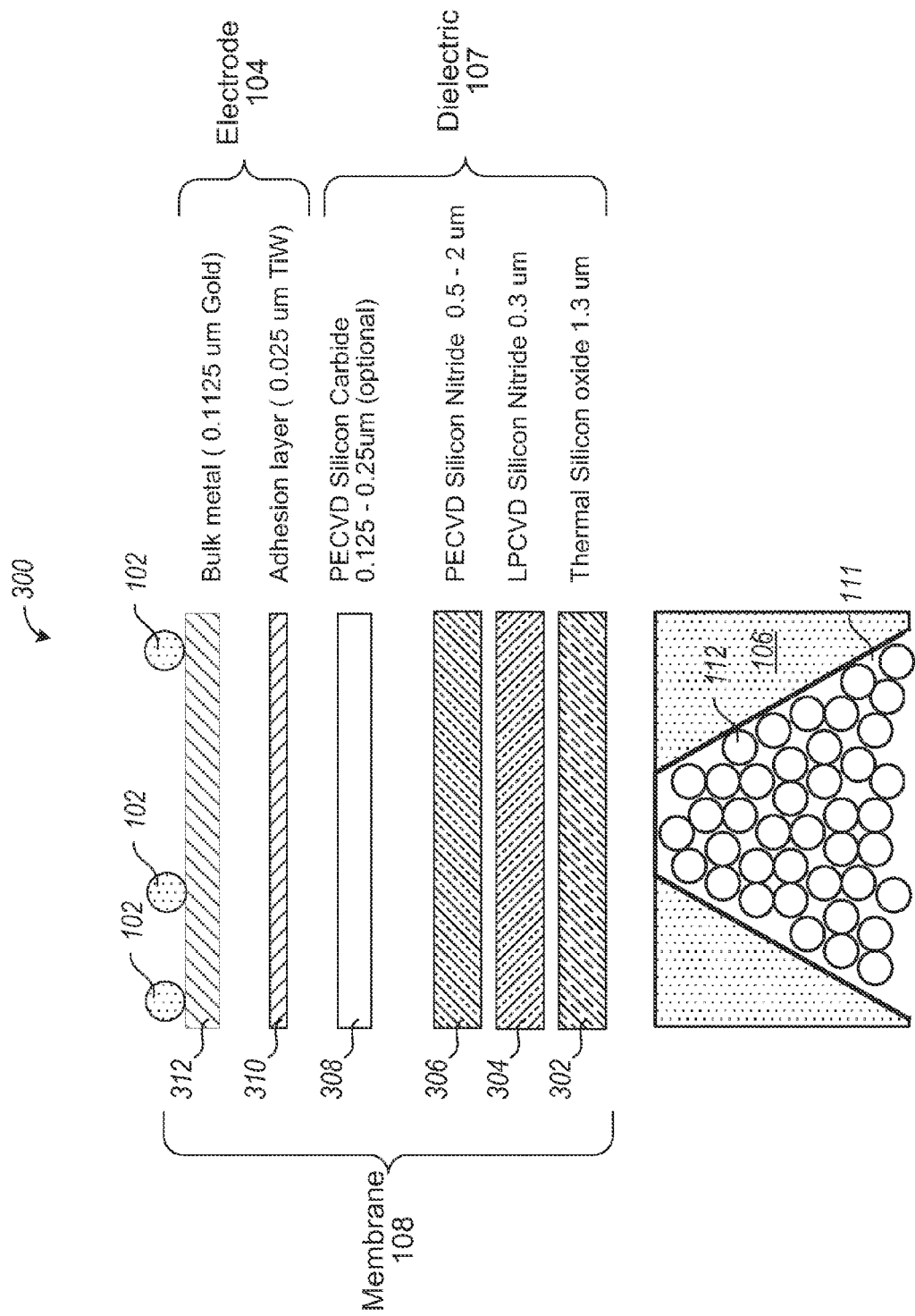
FIG. 3 illustrates components of the multi-layer membrane shown in FIG. 1.
Figure 4:
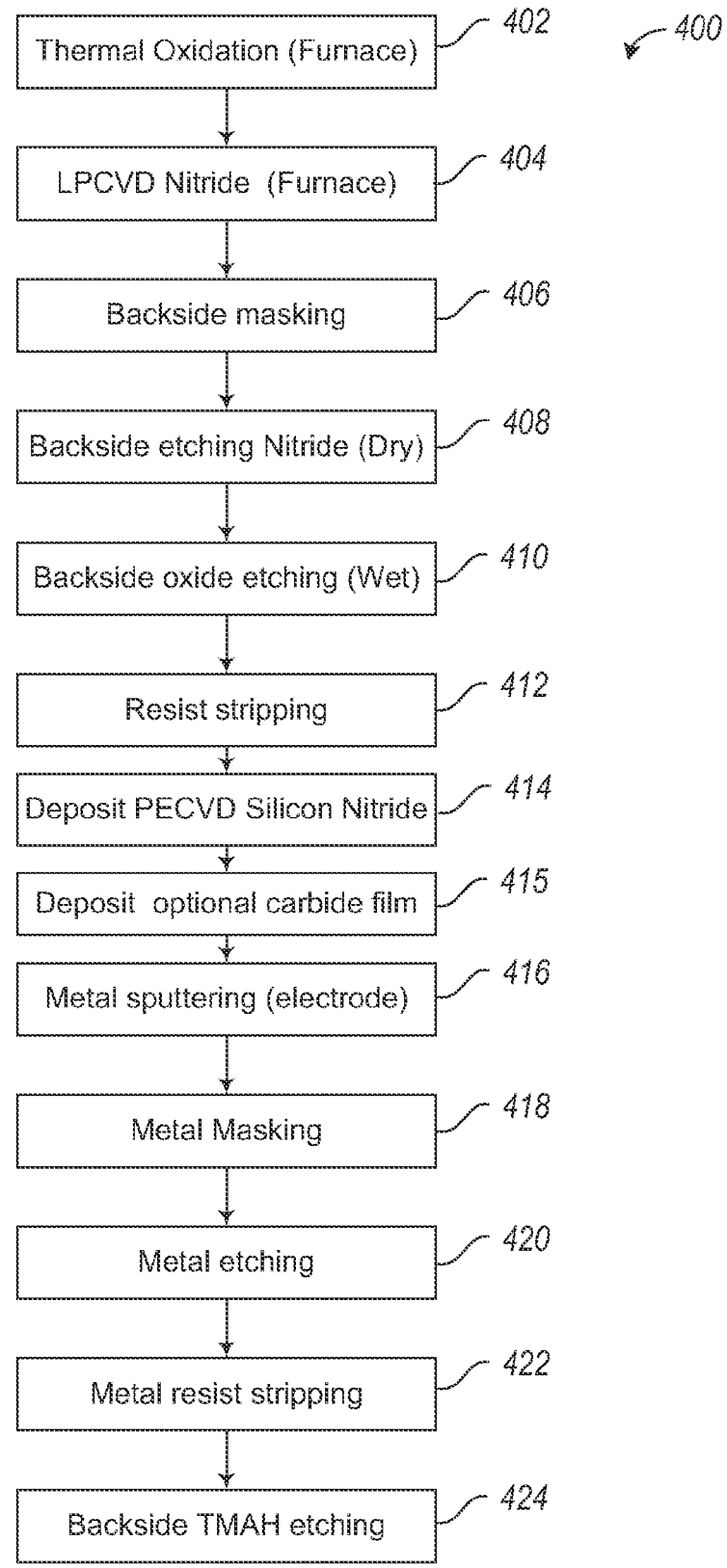
FIG. 4 is a detailed process flow diagram showing a sequence of process steps that can be used to produce the membrane portion of the structure shown in FIG. 1.

The layered structure 300 of the device 100 is shown in greater detail in FIG. 3, and with reference to corresponding detailed process steps shown in FIG. 4 as a process flow 400. The membrane 108 can include multiple constituent metal films within the electrode 104 and multiple constituent dielectric films within the dielectric layer 107. In the present embodiment that utilizes a silicon substrate 106, component films within the dielectric layer 107 can include, for example, two or more dielectric materials such as a silicon oxide layer 302, silicon nitride films 304 and 306, and a silicon carbide film 308. The silicon oxide layer 302 can be, for example, $SiO_2$ that is grown by a thermal oxidation process 402. Thermal oxidation of the bare silicon substrate 106 occurs when the substrate is exposed to an oxygenated environment in a hot furnace. If a batch process is used in which the substrate can be held on its edge, an oxide layer will form on both the front side 109 and the back side 110 of the silicon substrate 106. According to one embodiment, the thermal $SiO_2$ layer 302 is about 1.3 to 1.6 microns thick. In one alternative embodiment, a TEOS or other high density oxide is then deposited onto layer 302.

Next, a silicon nitride film 304 can be deposited by a low-pressure chemical vapor deposition (LPCVD) process 404 that is also carried out inside a furnace, with both sides of the substrate exposed, such that the nitride deposition also occurs on both sides of the substrate 106. According to one design embodiment, the LPCVD silicon nitride film 304 adjacent to the $SiO_2$ layer 302 is about 0.3 microns thick.

When deposition of the multi-layer membrane 108 is complete, the oxide and nitride layers 302 and 304, respectively, that have been formed on the back side 110 of the substrate 106, can be patterned together using a conventional photolithography process. First, a photolithography back side coating process can be used to mask the nitride surface of the back side 110 with photoresist. The photoresist is exposed through a reticle and developed to form a back side mask used to pattern exposed areas of the nitride film for etching. In the present embodiment, a dry etch process 408 is used to etch the back side nitride film 304, and the dry etch process 408 is then followed directly by a wet etch process 410 to remove corresponding areas of the oxide film, using the patterned nitride film as a mask for the oxide. The etch chemistry used for the wet etch process 410 is selective to not etch nitride. When the pattern has been etched into both the nitride and oxide films, the photoresist can be stripped in a process step 412, leaving behind a multi-layer dielectric mask. In other embodiments, different etching processes can be used, and in general, an alternative lithography process or non-lithography technologies can be used to pattern the back side dielectric layers.

Next, a second silicon nitride film 306 can be deposited by a plasma-enhanced chemical vapor deposition (PECVD) process step 414 that is carried out inside a vacuum chamber such that the second nitride film 306 only forms on the front side 109 of the silicon substrate. The second nitride film 306 is thus adjacent to the un-patterned front side LPCVD silicon nitride film 304. According to the present embodiment, the PECVD silicon nitride film 306 is within the range of about 0.5-2.0 microns thick.

Next, an optional silicon carbide layer can be deposited in a plasma-enhanced chemical vapor deposition (PECVD) process step 414 that is carried out inside a vacuum chamber, thus only contributing material to the front side of the substrate 106, on top of the second nitride film 306. According to this alternative embodiment, the thickness of the optional PECVD silicon carbide film 308 is within the range of about 0.125-0.25 microns. In some embodiments, the silicon carbide layer 308 is not present.

The electrode 104 is then formed adjacent to the multi-layer membrane 108. The electrode 104 can be formed by depositing a metal stack comprising two or more metal layers and then patterning the two layers together. For example, an adhesion layer 310 can be deposited first, as a means of securing the electrode by reducing the likelihood of delamination of the electrode 104 from the membrane 108. The adhesion layer is followed by a bulk metal layer 312. According to an exemplary design, the adhesion layer 310 can be a 0.025-micron thick layer of a Titanium Tungsten (TiW) alloy, and the bulk metal can be approximately 0.1125 microns of gold. Both metal layers can be deposited by a sputtering process 416 inside a vacuum chamber so that only the front side of the substrate 106 receives metal. An electroplating process would not be a suitable alternative for metal deposition for the present device because immersion in an electroplating solution would deposit metal onto the back side 110.

After metal deposition, the electrode 104 can be patterned using a standard lithographic process that entails a photoresist masking step 418, a metal etching step 420, and a photoresist stripping step 422. The metal etching step 420 can be either a dry etch, a wet chemical etch, or a sequence of both wet and dry etch steps. The membrane 108 is designed to serve as an etch stop layer for the metal etching step 420. Therefore the etch chemical used in etching step 420 is chosen to have a high selectivity to the dielectric films used in the membrane. According to the present method, the resulting metal pattern that defines the size of the electrode has a critical dimension, or a selected width, that is chosen so as to increase the likelihood of achieving a stable microstructure.

Finally, the void 111 is formed in the back side 110 of the substrate 106 by etching a deep, graded trench in the silicon using a solution of tetramethyl ammonium hydroxide (TMAH) in step 424. The substrate etch uses the multi-layer dielectric mask formed in process steps 406, 408, 410, and 412. The TMAH is necessarily selective to both nitride and oxide to preserve the multi-layer mask. After exposing and developing the photoresist, a deep trench is etched starting at the back side 110 and continuing through the silicon until it reaches the membrane-substrate interface at the front side 109, which serves as an etch stop for the back side silicon etch. If an etch chemistry other than TMAH is used to form the void 111, it has a selectivity of the etch chemistry to the materials used in the dielectric membrane that is sufficiently high, because the membrane materials are used as both a mask layer and an etch stop layer, while the etch rate of the substrate material must be high to consume a large amount of the substrate. An advantage of the multi-layer membrane 108 is its ability to maintain structural integrity while a large amount of the silicon substrate is being removed on one side to create the void 111. Trials using a simple oxide film instead of the multi-layer approach were not reliable in preventing structural failure. In particular, a low stress PECVD nitride film helps to prevent bulging of the membrane 108 after formation of the void 111. An additional advantage of the multi-layer membrane is that it protects the front side 109 of the substrate from defects induced by the back side coating process. According to an exemplary embodiment, the resulting void 111 measures approximately 525 microns deep and more than 100 microns wide at its widest point. The void 111 is then available for insertion of the magnetic compounds 112.

As the layers of material in the membrane 108 and the electrode 104 are formed, it is possible to control the mechanical stress in each layer of material by varying process equipment parameters such as temperatures and pressures within the processing chamber during each deposition step. Tuning the mechanical stresses in this way can result in an overall composite stress characterizing the membrane and electrode structure as a whole that is only slightly compressive, but not prone to delamination. If the stresses are not tuned, delamination can occur from the front side 109 or at the interface between the electrode 104 and the dielectric layer 107, either at the time when the void 111 is formed, or thereafter. During deposition of the adhesion layer, in particular, equipment parameters can be adjusted so that the resulting adhesion layer 310 is configured to exhibit a selectable amount of tensile stress in order to offset the composite compressive stress present in the membrane. Because the process parameters are often equipment-dependent, determining the proper adjustments can be done more effectively by repeated experimentation, using film stress measurements as a metric of success.

Figure 5:
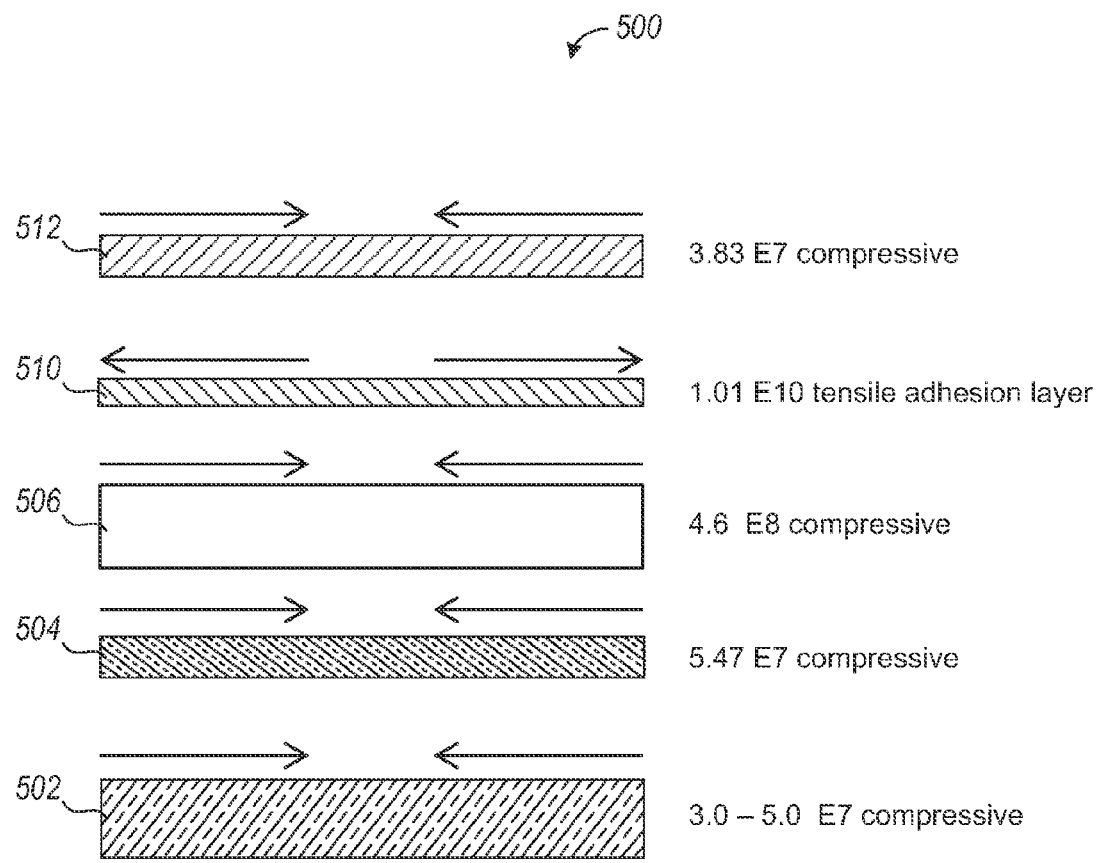
FIG. 5 is a side view of a membrane design indicating relative thicknesses and stresses of each layer.

Thus, it was determined empirically that, for the present embodiment, a stable structure like the one shown in FIGS. 6-9 is likely to result if the adhesion layer 310 is tuned to a selected tensile stress, and the other layers are tuned to have compressive stress. FIG. 5 illustrates the relative thicknesses of the different compressive and tensile thin films 502, 504, 506, 510, and 512 that form a stress-tuned membrane 500. The stress-tuned membrane 500 is one embodiment of the structure shown in FIG. 2. These films include, in order of deposition, a multi-layer membrane comprising an oxide film 502 having compressive stress in the range of 3.0-5.0 E7, an LPCVD silicon nitride film 504 having compressive stress of 5.47 E7, and a PECVD nitride film 506 having compressive stress of 4.6 E8; a metal electrode comprising a TiW adhesion film 510 having a tensile stress of 1.01 E10, and a gold film 512 having compressive stress of 3.83 E7. Although the stress-tuned membrane 500 is discussed herein in the context of providing a stable structure within the device 100, there may be other uses of the stress-tuned membrane 500 to provide stability to other types of structures that would otherwise be prone to stress-induced damage.

Figure 6:
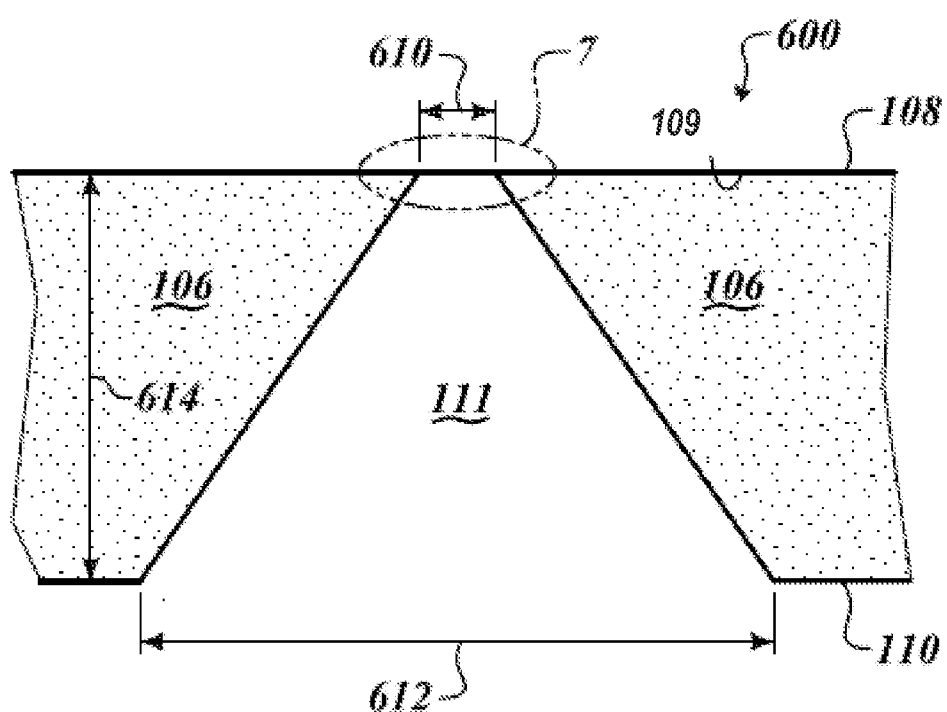
FIGS. 6-9 show a sequence of side views of increasing magnification, wherein the images are derived from cross-sectional scanning electron microscope (SEM) images of actual samples that maintained structural integrity throughout the fabrication process.

FIGS. 6-9 are derived from actual SEM images of sample structures produced by the process flow 400 illustrated in FIG. 4, after completion of the metallization process. FIGS. 6-9 show, to scale, the different film thicknesses achieved as well as a comparative view of the relative dimensions of the various structural elements within the multi-layer membrane 108, at successively higher magnifications. FIG. 6 is a side elevation view of a whole, exemplary, fabricated micro-electrochemical device structure 600, shown at 120× magnification. The device structure 600 is thus a scaled embodiment of the structure for the sensor 100, prior to introduction of the magnetic sources and detectors. The device structure 600 includes the silicon substrate 106 and a multi-layer membrane 108, positioned over a void 111 in the substrate. A membrane-substrate interface is at the front side 109 of the substrate 106. FIG. 6 shows the dimensions of the multi-layer membrane 108 relative to the void 111, and demonstrates that the multi-layer membrane 108 remains intact despite the extent of the void 111 in the supporting substrate 106 underneath the multi-layer membrane 108. The critical dimension of the multi-layer membrane 108 is the selected top width 610 of the void 111 at the membrane-substrate interface, which, for the present design, generally exceeds 100 microns. In FIG. 6, for example, the top width 610 measures 124.5 microns. The base width 612 of the void 111 opposite the membrane measures about 700 microns and the depth 614 of the void 111 (i.e., the thickness of the silicon substrate) is about 600 microns.

Figure 7:
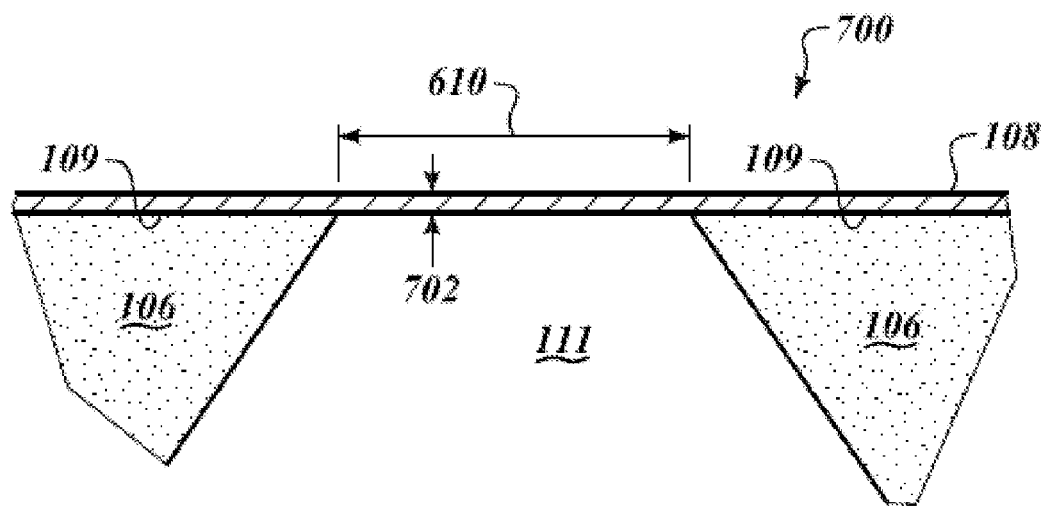

FIG. 7 is a detail view of a region of interest 700 within FIG. 5, at the membrane-substrate interface. The magnification used to obtain the image from which FIG. 7 is derived was 600×. The total measured thickness 702 of the multi-layer membrane 108 at this magnification is about 3.6 microns. The total thickness of the dielectric layer 107 can be matched to the radius and material of the beads by design so that magnetic forces, which decrease with distance across the dielectric, are strong enough to be detected by the paramagnetic beads.

Figure 8:
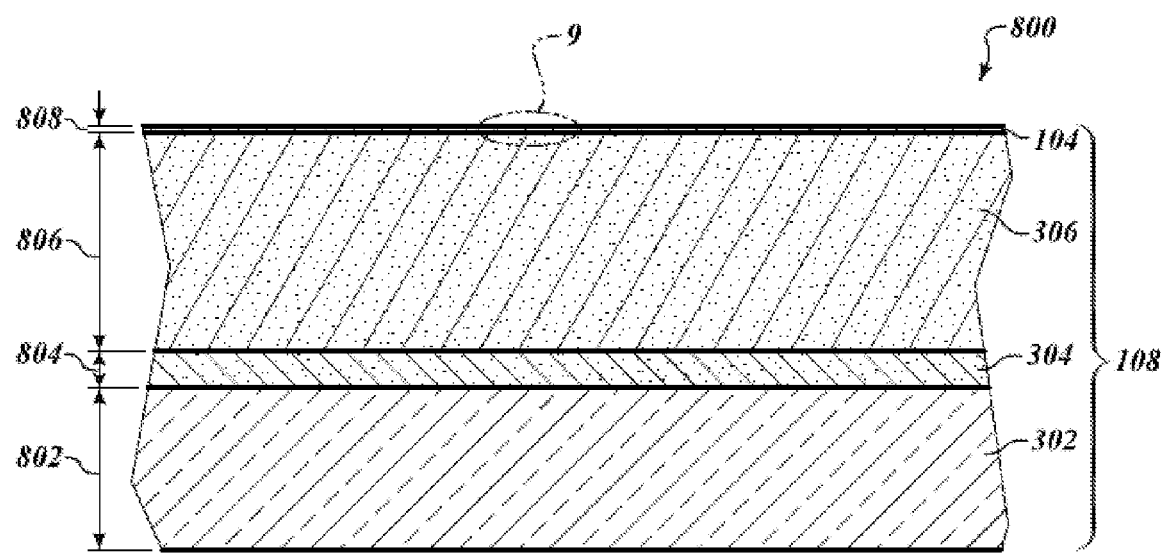

FIG. 8 is a membrane-electrode detail view 800 derived from a scanning electron micrograph at 20,000× magnification, showing individual films formed within the multi-layer membrane 108, and indicating their relative dimensions. The embodiment shown omits the optional silicon carbide film. The films shown are, from bottom to top, the silicon oxide layer 302, the LPCVD silicon nitride film 304, the PECVD silicon nitride film 306, and the electrode 104. In the embodiment shown in FIG. 8, the thickness 802 of the oxide 302 measures 1.28 microns, the thickness 804 of the LPCVD silicon nitride 304 measures 0.29 microns, the thickness 806 of the PECVD silicon nitride 306 measures 1.90 microns, and the thickness 808 of the metal stack measures 119.3 nm.

Figure 9:
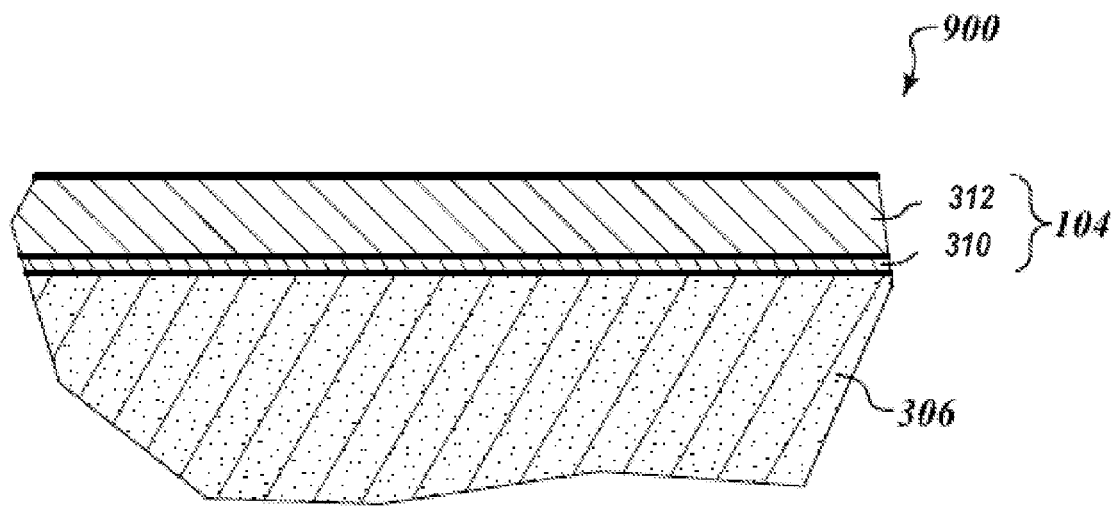

FIG. 9 is an electrode detail view 900 of the type derived from a scanning electron micrograph of the electrode 104. The electrode 104 is in contact with the PECVD nitride film 306. In the embodiment shown, the electrode 104 includes the TiW adhesion layer 310 measuring 22.0 nm, and a bulk metal layer 312 of gold measuring 93.7 nm. The TiW adhesion layer reduces the overall stress within the multi-layer membrane 108 and also assists in adhering the bulk metal layer 312 to the nitride film 306.

Figure 10:
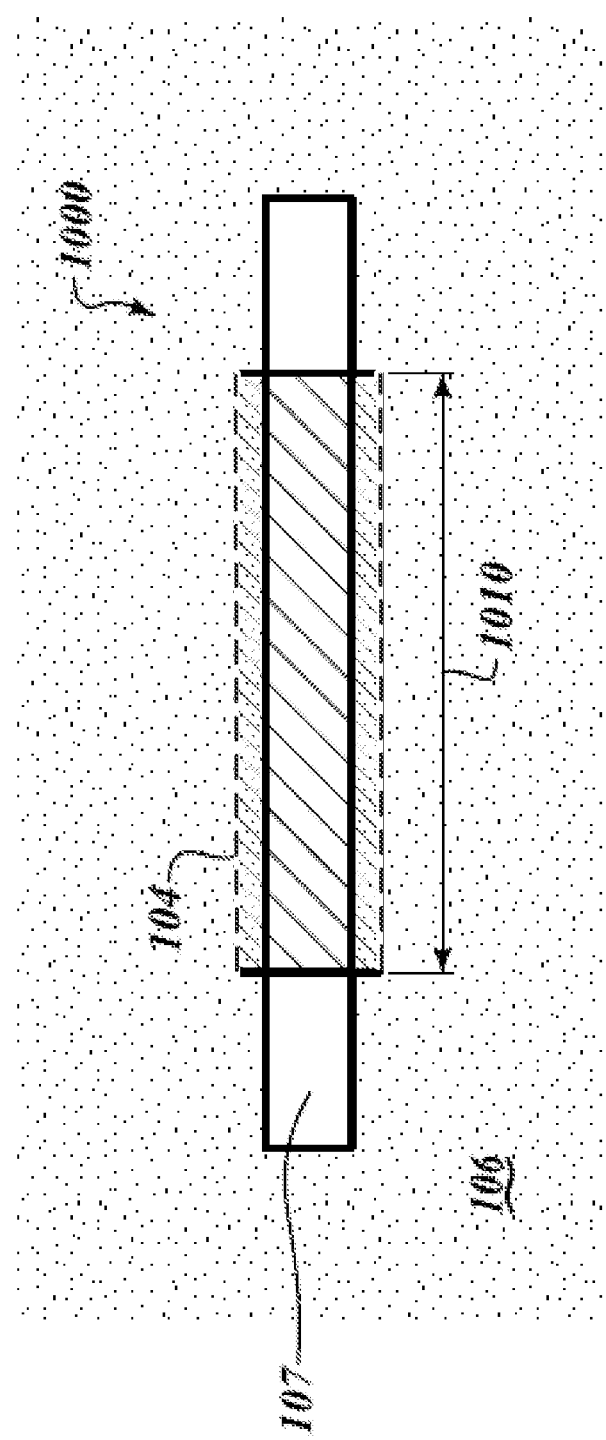
FIG. 10 is a bottom plan view derived from an optical image of a finished membrane-electrode structure as seen from the back side of the substrate.

FIG. 10 is derived from an optical image of a fabricated membrane-electrode structure 1000, as taken from the back side 110 through the substrate 106. The structure 1000 includes a dielectric layer 107 in contact with a patterned electrode 104. The patterned electrode 104 is complete after the photoresist stripping step 422. In the embodiment shown in FIG. 10, a length 1010 of the patterned electrode 1008 measures about 700 microns.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An apparatus that includes a multi-layer membrane on a silicon substrate, the apparatus comprising:
   a dielectric layer that extends across a cavity between portions of the silicon substrate, the dielectric layer having a first compressive stress;
   an adhesion layer in contact with the dielectric layer, the adhesion layer having a tensile stress; and
   a metal electrode in contact with the adhesion layer, the metal electrode having a second compressive stress and a width.

2. The apparatus according to claim 1, wherein the dielectric layer includes two different dielectric materials.

3. The apparatus according to claim 2, further including a silicon carbide film that is one of the dielectric materials.

4. The apparatus according to claim 2, wherein the dielectric materials include silicon dioxide and silicon nitride.

5. The apparatus according to claim 1, wherein the dielectric layer is above the cavity in the silicon substrate.

6. The apparatus according to claim 5, wherein a ratio of a width of the cavity to the width of the metal electrode exceeds two.

7. The apparatus according to claim 5, having a membrane thickness, wherein the ratio of the width of the cavity to the membrane thickness exceeds 10.

8. The apparatus according to claim 5, further comprising magnetic compounds contained within the cavity.

9. The apparatus according to claim 1, wherein the metal electrode includes gold.

10. The apparatus according to claim 1, wherein the adhesion layer is made from a tungsten alloy.

11. The apparatus according to claim 8, wherein a fluid occupies the cavity.

12. The apparatus according to claim 8, further comprising a plurality of paramagnetic beads, wherein the metal electrode is capable of carrying an electric current induced by a magnetic force of attraction between the magnetic compounds and the paramagnetic beads, each paramagnetic bead held in contact with a top surface of the metal electrode by the magnetic force.

13. The apparatus according to claim 12, wherein an induced electric current carried by the metal electrode indicates an amount of the magnetic compounds.

* * * * *